(12) United States Patent
Xu (10) Patent No.: US 10,714,711 B2
(45) Date of Patent: Jul. 14, 2020

(54) METHOD OF MAKING OLED DISPLAY DEVICE HAVING FIRST SUBSTRATE ALIGNING ACCURATELY WITH MASK PLATES

(71) Applicant: Wuhan China Star Optoelectronics Semiconductor Display Technology Co., Ltd., Wuhan (CN)

(72) Inventor: Chao Xu, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/576,199

(22) PCT Filed: Oct. 21, 2017

(86) PCT No.: PCT/CN2017/107178
§ 371 (c)(1),
(2) Date: Sep. 28, 2018

(87) PCT Pub. No.: WO2019/033542
PCT Pub. Date: Feb. 21, 2019

(65) Prior Publication Data
US 2019/0386254 A1 Dec. 19, 2019

(30) Foreign Application Priority Data

Aug. 18, 2017 (CN) .......................... 2017 1 0728544

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3251* (2013.01); *H01L 51/0011* (2013.01)

(58) Field of Classification Search
CPC ... H01L 51/56; H01L 51/0011; H01L 51/003; H01L 27/3251
See application file for complete search history.

(56) References Cited

U.S. PATENT DOCUMENTS 8,236,126 B2 * 8/2012 Chen ..................... B32B 37/185
156/247
2003/0043337 A1 * 3/2003 Takabayashi ......... G02F 1/1333
349/187

(Continued)

FOREIGN PATENT DOCUMENTS

CN  102650819 A  8/2012
CN  102651457 A  8/2012

(Continued)

*Primary Examiner* — Quoc D Hoang
(74) *Attorney, Agent, or Firm* — Brinks Gilson & Lione (57) ABSTRACT

The present disclosure provides an OLED display device and a method of making the same. The method includes defining a recess in a first substrate; forming an alignment mark outside the recess; forming a second substrate in the recess; forming a thin film transistor layer and a pixel array layer sequentially on the second substrate. In the present disclosure, the first substrate is accurately aligned with mask plates when forming the pixel array layer, and the second substrate is not deformed during the process of vapor deposition, thereby avoiding the problem of color mixed in vapor deposition.

12 Claims, 6 Drawing Sheets

(56) References Cited

U.S. PATENT DOCUMENTS

| | | | |
|---|---|---|---|
| 2014/0283632 A1* | 9/2014 | Fix | G01D 11/30 |
| | | | 73/866.5 |
| 2017/0025632 A1* | 1/2017 | Lee | H01L 23/544 |
| 2017/0153479 A1 | 6/2017 | Song | |
| 2017/0278905 A1* | 9/2017 | Hsu | G09G 3/3233 |

FOREIGN PATENT DOCUMENTS

| | | |
|---|---|---|
| CN | 104090427 A | 10/2014 |
| CN | 106756806 A | 5/2017 |
| JP | 2005093799 A | 4/2005 |

\* cited by examiner

METHOD OF MAKING OLED DISPLAY DEVICE HAVING FIRST SUBSTRATE ALIGNING ACCURATELY WITH MASK PLATES

CROSS-REFERENCE TO RELATED APPLICATIONS

The present application is a 35 U.S.C. § 371 National Phase conversion of International (PCT) Patent Application No. PCT/CN2017/107178 filed Oct. 21, 2017, which claims foreign priority of Chinese Patent Application No. 201710728544.3, filed on Aug. 18, 2017 in the State Intellectual Property Office of China, the contents of all of which are hereby incorporated by reference.

TECHNICAL FIELD

This disclosure relates generally to the field of display technology, and more particularly, to an OLED display device and method of making the same.

BACKGROUND

Organic Light-Emitting Diode (OLED) display device is widely recognized as the next generation display technology due to its advantage of high brightness, fast response, low energy consumption and flexibility. Wherein, compared with a liquid crystal display (LCD), the biggest advantage of an OLED display device is that it can be made into ultra-thin, transparent, flexible, foldable display devices. A method for making a flexible OLED display device is generally to form a flexible substrate on a glass substrate. After preparing a thin film transistor layer and a pixel array layer on the flexible substrate, the flexible substrate and the glass substrate are separated to obtain a flexible OLED display device.

The inventors of the present application have found during their long time research that alignment marks are usually provided on a flexible substrate to facilitate alignment between the mask plate and the glass substrate when the pixel array layer is prepared by a vapor deposition method and using a mask plate. However, since the color of the flexible substrate is dark yellow and the deposition process is carried out with a face-down coating method, the alignment marks cannot be caught at the preparation of the pixel array layer, resulting in failure of alignment. In addition, due to the high temperature in the vapor deposition process, the flexible substrate is prone to deformation, resulting in the alignment not accurate and color mixed in vapor deposition.

SUMMARY

The present disclosure provides an OLED display device and manufacturing method therefore in order to solve the problems of alignment marks not being caught due to the color of the flexible substrate being dark and color mixed due to deformation of the flexible substrate in the vapor deposition process resulting in alignment inaccurately.

In order to solve the above problems, the present disclosure provides a method of making an OLED display device, comprising:

defining a recess in a first substrate;
forming an alignment mark outside the recess;
forming a second substrate in the recess;
forming a thin film transistor layer and a pixel array layer sequentially on the second substrate.

In order to solve the above problems, the present disclosure further provides an OLED display device made by the above described method.

In the present disclosure, by defining a recess in the first substrate and providing alignment marks outside the recess and forming a second substrate in the recess, the first substrate and the mask plates can be aligned accurately when preparing the pixel array layer, and the second substrate does not generate deformation during the process of vapor deposition, thereby avoiding the problem of color mixed in vapor deposition.

DETAILED DESCRIPTION

Below, technical proposals of embodiments of the present disclosure will be described clearly and completely with reference to the drawings of the embodiments. Apparently, the described embodiments are merely part of, rather than all of the embodiments of the present disclosure. Based on the described embodiments of the present disclosure, any other embodiments obtained by a person skilled in the art without paying creative efforts shall also fall within the scope of the present disclosure.

Figure 1:
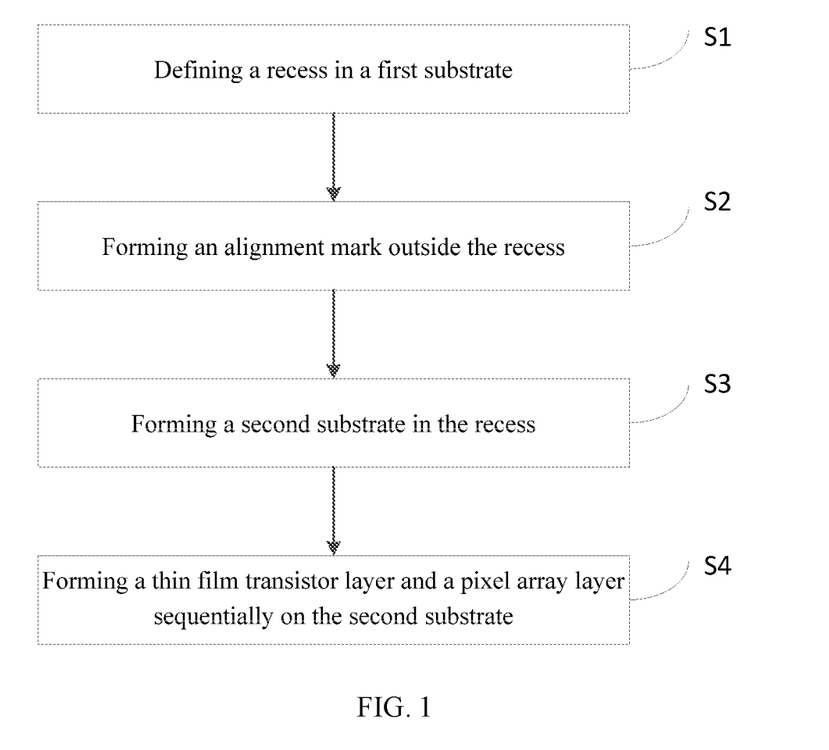
FIG. 1 is a block diagram of a method of making an OLED display device according to an embodiment of the disclosure.

Referring to FIG. 1, a method of making an OLED display device in accordance with an embodiment of the present disclosure comprises:

S1, defining a recess in the first substrate;
Optionally, the first substrate may be a glass substrate.
Optionally, recesses may be defined by etching, cutting, or the like.

S2, forming an alignment mark outside of the recess;
Optionally, at least two alignment marks may be provided at outside of the recess, i.e., at the edges of the first substrate. The alignment marks may be cross-shaped, circular-shaped, square-shaped, or the like.

S3, forming a second substrate in the recess;
Optionally, the second substrate may be a Polyimide (PI) flexible substrate.

S4, forming a thin film transistor layer and a pixel array layer sequentially on the second substrate.
Optionally, the pixel array layer may include red sub-pixels, blue sub-pixels, and green sub-pixels; or the pixel array layer may include white sub-pixels, red sub-pixels, blue sub-pixels, and green sub-pixels.

In the embodiment of the present disclosure, by defining a recess in the first substrate, forming an alignment mark outside the recess and forming a second substrate in the recess, the first substrate and the mask plate can be aligned accurately when preparing the pixel array layer, and the second substrate does not generate deformation during the process of vapor deposition, thereby avoiding the problem of color mixed in vapor deposition.

Figure 2:
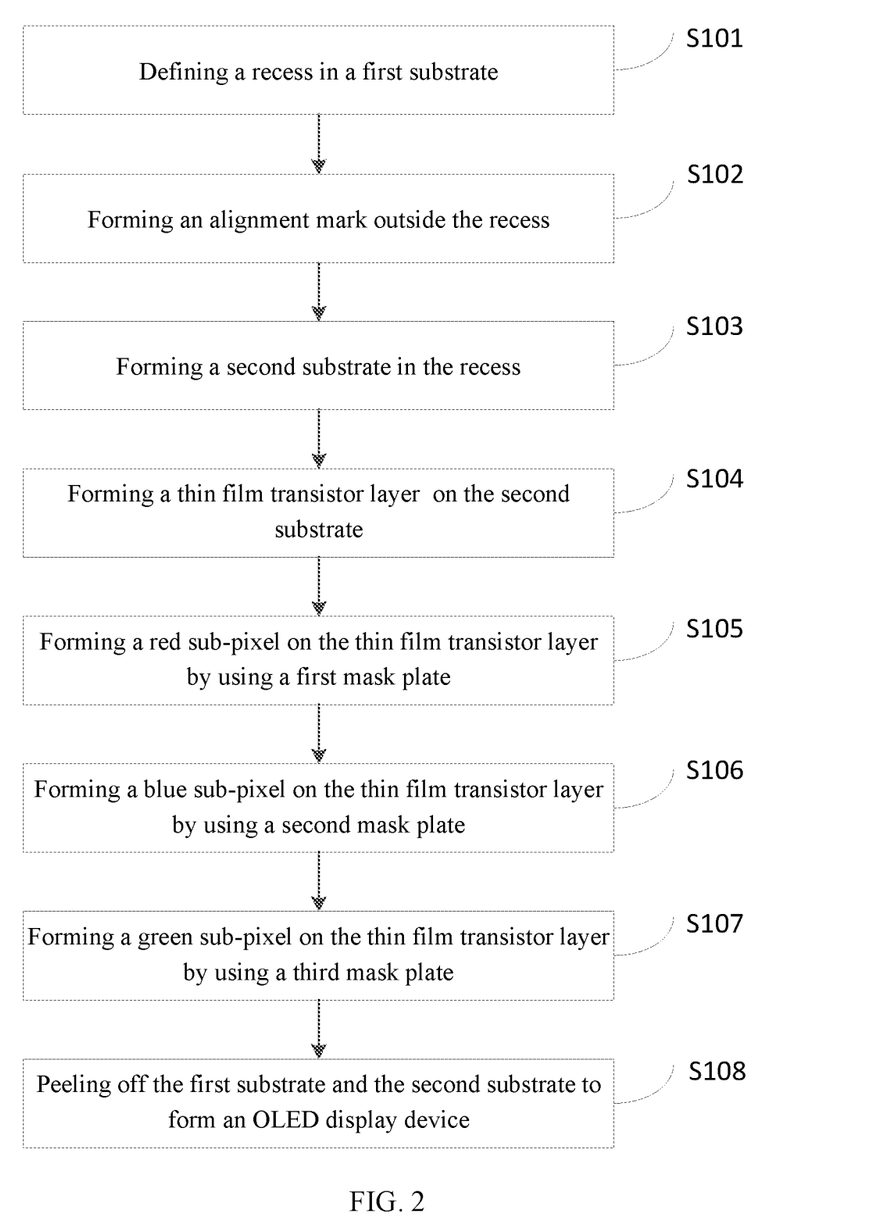
FIG. 2 is a block diagram of a method of making an OLED display device according to another embodiment of the disclosure.
Figure 4A:
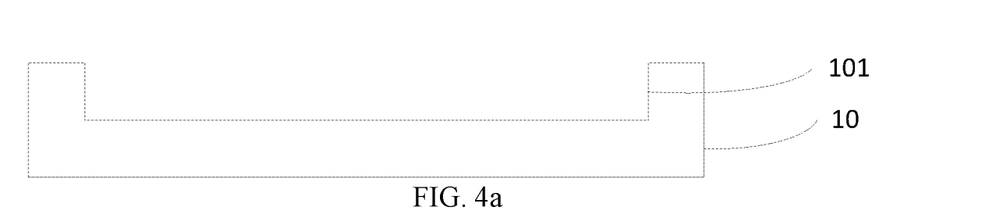
FIGS. 4a-4i are process flow diagrams of the method of making an OLED display device according to another embodiment of the disclosure.
Figure 4B:
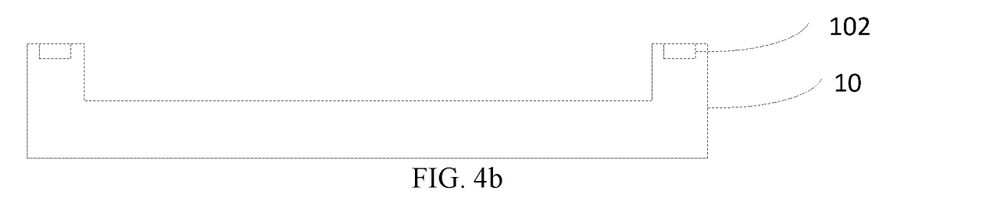
Figure 4C:
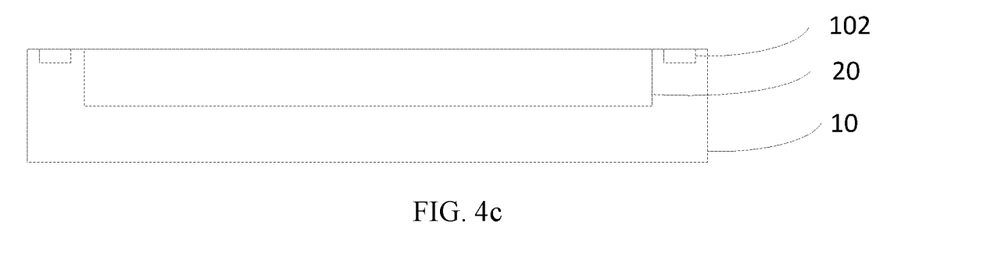
Figure 4D:
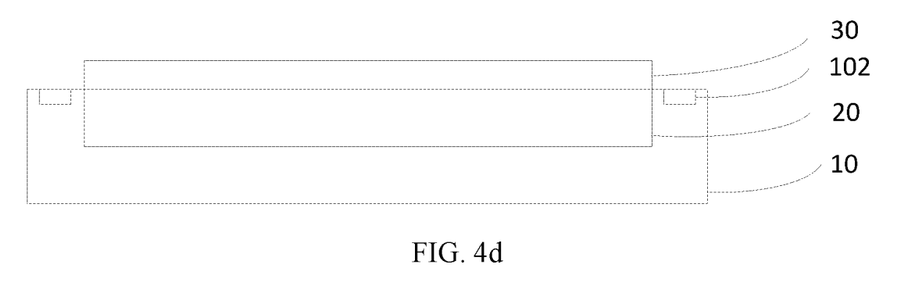
Figure 4E:
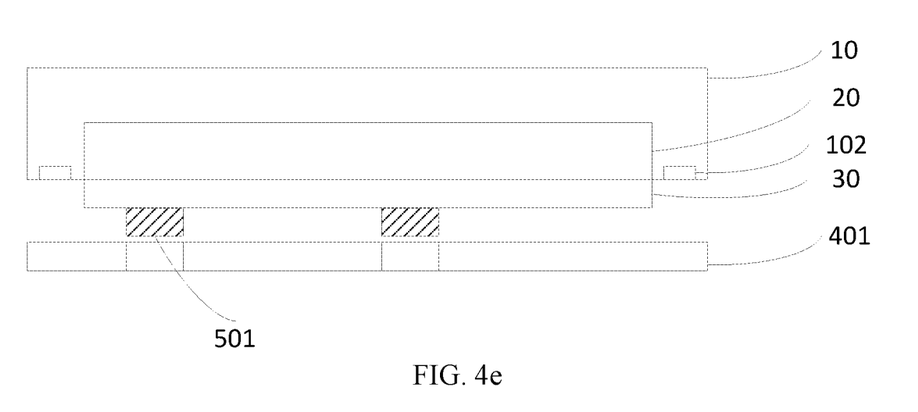
Figure 4F:
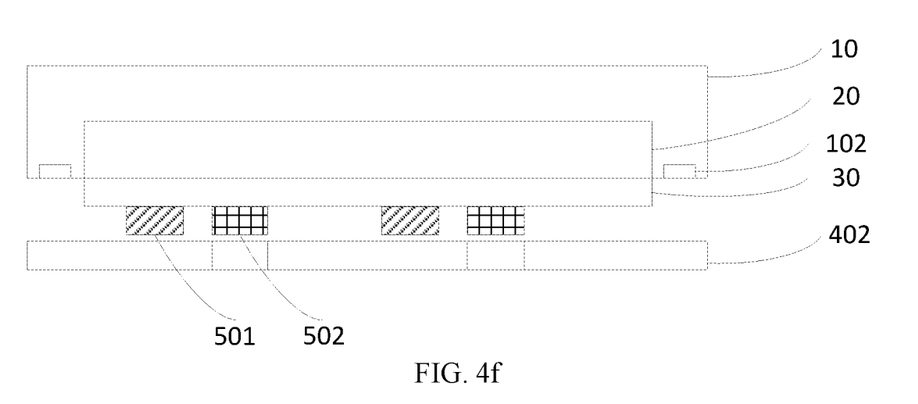
Figure 4G:
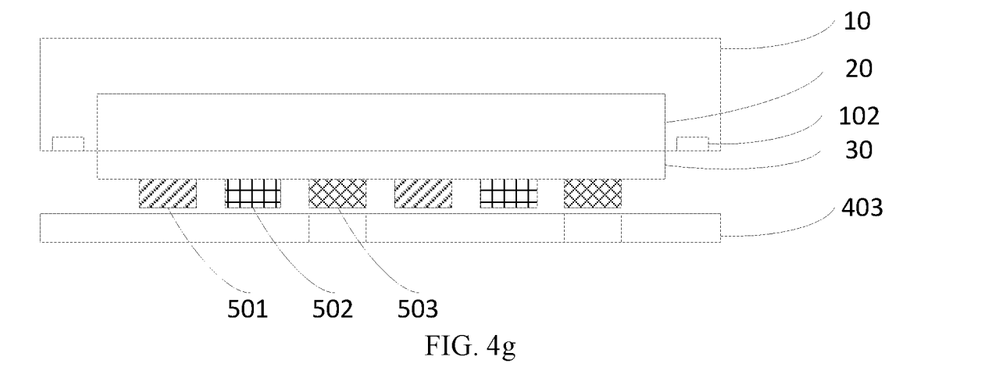
Figure 4H:
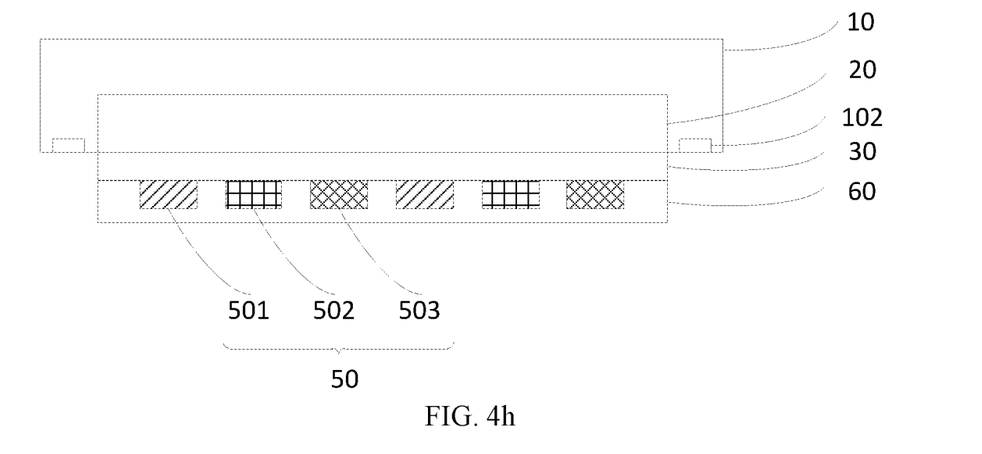
Figure 4I:
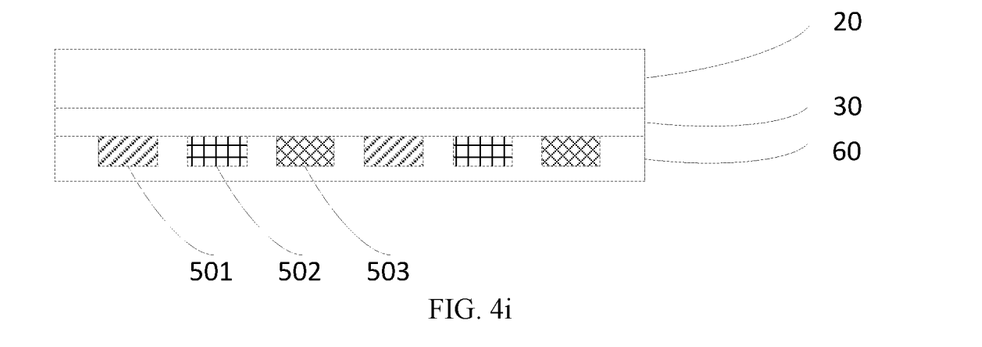

Referring to FIGS. 2 to 4i, a method of manufacturing an OLED display device in accordance with another embodiment of the present disclosure comprises:

S101, defining a recess 101 in the first substrate 10;

The first substrate 10 may be a rectangular parallelepiped substrate and the recess 101 may be rectangular parallelepiped recess. The length of the recess 101 is less than the length of the first substrate 10 and the width of the recess 101 is less than the width of the first substrate 10, and the depth of the recess 101 is less than the height of the first substrate 10.

S102, forming an alignment mark 101 outside the recess 101;

Optionally, at least two alignment marks 102 may be provided at the edges of the first substrate 10. The mark 102 may be cross-shaped, circular-shaped, square-shaped, or the like.

Figure 3:
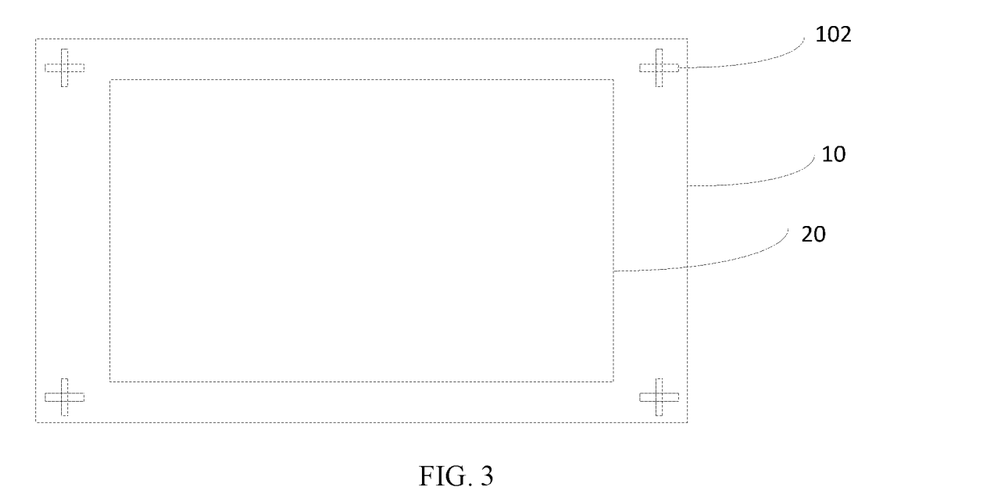
FIG. 3 is top plane view of the first substrate and the second substrate of the method of making an OLED display device according to another embodiment of the disclosure.

In the present embodiment, four cross-shaped alignment marks 102 may be provided at the four corners of the first substrate 10, respectively.

S103, forming a second substrate 20 in the recess 101;

Optionally, the second substrate 20 may be formed by coating or the like, and then the second substrate 20 may be firmly adhered to the first substrate 10 by the method of high temperature baking or the like.

Optionally, the length and width of the second substrate 20 may be respectively equal to the length and width of the recess 101, and the thickness of the second substrate 20 is equal to or less than the depth of the recess 101.

Optionally, the second substrate 20 may be a flexible substrate and may be made of PI.

S104, forming a thin film transistor layer 30 on the second substrate 20;

Optionally, a pixel array layer 50 may be formed on the thin film transistor layer 30, and in the present embodiment, the pixel array layer 50 includes a red sub-pixel 501, a blue sub-pixel 502, and a green sub-pixel 503.

In the present embodiment, the pixel array layer 50 is formed by a face-down coating method, and specifically includes:

S105, forming the red sub-pixel 501 on the thin film transistor layer 30 by using a first mask plate 401;

Optionally, the first substrate 10 and the first mask plate 401 may be aligned, and the red sub-pixel 501 may be formed on the thin film transistor layer 30;

Optionally, the first mask plate 401 may be aligned with the first substrate 10 by the alignment marks 102.

S106, forming the blue sub-pixel 502 on the thin film transistor layer 30 by using a second mask plate 402;

Optionally, the first substrate 10 and the second mask plate 402 may be aligned, and the blue sub-pixel 502 may be formed on the thin film transistor layer 30;

Optionally, the second mask plate 402 may be aligned with the first substrate 10 by the alignment marks 102.

S107, forming the green sub-pixel 503 on the thin film transistor layer 30 by using a third mask plate 403;

Optionally, the first substrate 10 and the third mask plate 403 may be aligned, and the green sub-pixel 503 may be formed on the thin film transistor layer 30;

Optionally, the third mask plate 403 and the first substrate 10 may be aligned by the alignment marks 102.

Optionally, the thin film transistor layer 30 may be formed by a method of vapor deposition, and the thermal expansion of the second substrate 20 during the vapor deposition process is limited by the recess 101 so that the second substrate 20 does not generate deformation, the first mask plate 401, the second mask plate 402 and the third mask plate 403 are aligned with the first substrate 10 accurately to avoid the positions of the red sub-pixel 501, the blue sub-pixel 502, and the green sub-pixel 503 being overlapped which results in color mixed in vapor deposition.

Optionally, an encapsulation layer 60 may be formed on the pixel array layer 50.

S108, the first substrate 10 and the second substrate 20 are peeled off to form an OLED display device.

Optionally, the first substrate 10 and the second substrate 20 may be peeled off by laser peeling or the like. Since the second substrate 20 is a flexible substrate, the OLED display device formed after the peeling is a flexible OLED display device.

In the embodiment of the present disclosure, by defining a recess in the first substrate, providing an alignment mark outside the recess and forming a second substrate in the recess, the first substrate and the mask plates can be aligned accurately when preparing the pixel array layer, and the second substrate does not generate deformation during the process of vapor deposition, thereby avoiding the problem of color mixed in vapor deposition.

Figure 5:
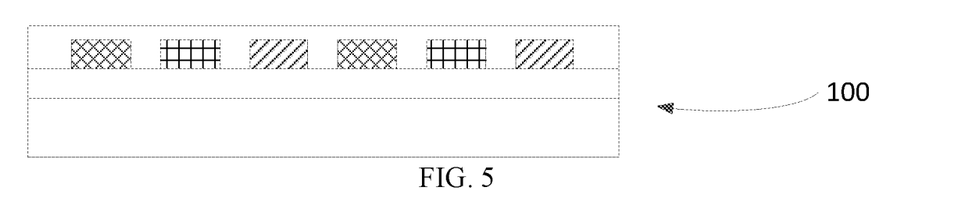
FIG. 5 illustrates an OLED display device according to an embodiment of the present disclosure.

Referring to FIG. 5, the OLED display device of an embodiment of the present disclosure is prepared by the above-described method of manufacturing an OLED display device.

Specifically, the structure of the OLED display device of an embodiment of the present disclosure is described with reference to the above-described manufacturing method of an OLED display device and is not repeated here.

In the embodiment of the present disclosure, by defining a recess in the first substrate and providing an alignment mark outside the recess, a second substrate is formed in the recess, the first substrate and the mask plates can be aligned accurately when preparing the pixel array layer, and the second substrate does not generate deformation during the vapor deposition process, thereby avoiding the problem of vapor deposition.

The above description merely depicts some exemplary embodiments of the disclosure, but is not limiting the scope of the disclosure. Any equivalent structure or flow transformations made to the disclosure, or any direct or indirect applications of the disclosure on any other related fields, shall all be covered within the protection of the disclosure.

What is claimed is:

1. A method of making an OLED display device, comprising:
   defining a recess in a first substrate;
   forming an alignment mark outside the recess;
   forming a second substrate in the recess;
   forming a thin film transistor layer and a pixel array layer sequentially on the second substrate;
   wherein the first substrate is a rectangular parallelepiped substrate and the recess is a rectangular parallelepiped recess, a length of the recess is less than a length of the first substrate, a width of the recess is less than a width of the first substrate, and a depth of the recess is less than a height of the first substrate; and
   a thickness of the second substrate is less than or equal to the depth of the recess;
   wherein the forming the pixel array layer comprises:
   forming a red sub-pixel on the thin film transistor layer by using a first mask plate;

forming a blue sub-pixel on the thin film transistor layer by using a second mask plate;

forming a green sub-pixel on the thin film transistor layer by using a third mask plate; and aligning the first substrate with the first mask plate, the second mask plate and the third mask plate respectively in order to form the red sub-pixel, the blue sub-pixel and the green sub-pixel.

2. The method according to claim 1, wherein the quality of the alignment marks is four and respectively provided at four corners of the first substrate.

3. The method according to claim 1, wherein the pixel array layer is formed by vapor deposition and during a process of vapor deposition the thermal expansion of the second substrate is limited in the recess to avoid generating deformation.

4. The method according to claim 1, after forming the thin film transistor layer and the pixel array layer sequentially on the second substrate, further comprising:

peeling off the first substrate and the second substrate to form the OLED display device.

5. The method according to claim 1, wherein the second substrate is a flexible substrate.

6. A method of making an OLED display device, comprising:

defining a recess in a first substrate;

forming an alignment mark outside the recess;

forming a second substrate in the recess;

forming a thin film transistor layer and a pixel array layer sequentially on the second substrate;

wherein the forming the pixel array layer comprises:

forming a red sub-pixel on the thin film transistor layer by using a first mask plate;

forming a blue sub-pixel on the thin film transistor layer by using a second mask plate;

forming a green sub-pixel on the thin film transistor layer by using a third mask plate; and aligning the first substrate with the first mask plate, the second mask plate and the third mask plate respectively in order to form the red sub-pixel, the blue sub-pixel and the green sub-pixel.

7. The method according to claim 6, wherein the first substrate is a rectangular parallelepiped substrate and the recess is a rectangular parallelepiped recess, a length of the recess is less than a length of the first substrate, a width of the recess is less than a width of the first substrate, and a depth of the recess is less than a height of the first substrate.

8. The method according to claim 6, wherein the quality of the alignment marks is four and respectively provided at four corners of the first substrate.

9. The method according to claim 6, wherein the pixel array layer is formed by vapor deposition and during a process of vapor deposition the thermal expansion of the second substrate is limited in the recess to avoid generating deformation.

10. The method according to claim 6, wherein a thickness of the second substrate is less than or equal to a depth of the recess.

11. The method according to claim 6, after forming the thin film transistor layer and the pixel array layer sequentially on the second substrate, further comprising:

peeling off the first substrate and the second substrate to form the OLED display device.

12. The method according to claim 6, wherein the second substrate is a flexible substrate.

* * * * *